(12) United States Patent
Kim et al.

(10) Patent No.: US 10,485,104 B2
(45) Date of Patent: Nov. 19, 2019

(54) PRINTED CIRCUIT BOARD, MEMORY MODULE AND MEMORY SYSTEM INCLUDING THE SAME

(71) Applicant: SAMSUNG ELECTRONICS CO., LTD., Suwon-si (KR)

(72) Inventors: Jong-Min Kim, Suwon-si (KR); Do-Hyung Kim, Hwaseong-si (KR); Kyoung-Sun Kim, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/103,284

(22) Filed: Aug. 14, 2018

(65) Prior Publication Data

US 2019/0191563 A1    Jun. 20, 2019

(30) Foreign Application Priority Data

Dec. 19, 2017  (KR) .......................... 10-2017-0174934

(51) Int. Cl.
    *H05K 1/11*      (2006.01)
    *H05K 1/02*      (2006.01)
(52) U.S. Cl.
    CPC ............. *H05K 1/112* (2013.01); *H05K 1/024* (2013.01); *H05K 1/0245* (2013.01); *H05K 1/0253* (2013.01)

(58) Field of Classification Search
    USPC .................................................. 361/760, 761
    See application file for complete search history.

(56) References Cited

U.S. PATENT DOCUMENTS

| | | | |
|---|---|---|---|
| 7,307,220 B2 | 12/2007 | Barnette | |
| 7,583,513 B2 | 9/2009 | Boggs et al. | |
| 8,586,873 B2 | 11/2013 | Wu | |
| 8,813,000 B2 | 8/2014 | Chun et al. | |
| 8,822,831 B2 | 9/2014 | Yokoyama | |
| 9,618,983 B2 | 4/2017 | Kim et al. | |
| 2011/0094783 A1* | 4/2011 | Zhou | H05K 1/0253 174/260 |
| 2012/0305299 A1* | 12/2012 | Chen | H05K 1/0251 174/257 |

* cited by examiner

*Primary Examiner* — Andargie M Aychillhum
(74) *Attorney, Agent, or Firm* — Sughrue Mion, PLLC (57) ABSTRACT

A printed circuit board (PCB) includes a first insulating layer, a pad disposed on the first insulating layer, and a first reference layer on which the first insulating layer is disposed, the first reference layer including a dielectric passage for forming a return path of a signal that is transmitted to the pad, and a conductive line disposed in the dielectric passage and disposed to form a transmission path of the signal. The PCB further includes a second insulating layer on which the first reference layer is disposed, and a second reference layer on which the second insulating layer is disposed, the second reference layer further forming the return path. A capacitance of the pad corresponds to a distance between the pad and the second reference layer.

20 Claims, 9 Drawing Sheets

FIG. 16

PRINTED CIRCUIT BOARD, MEMORY MODULE AND MEMORY SYSTEM INCLUDING THE SAME

CROSS-REFERENCE TO RELATED APPLICATION

This application claims priority from Korean Patent Application No. 10-2017-0174934, filed on Dec. 19, 2017, in the Korean Intellectual Property Office (KIPO), the disclose of which is incorporated herein by reference in its entirety.

BACKGROUND

1. Field

Apparatuses consistent with example embodiments relate to a printed circuit board (PCB), a memory module and a memory system including the same, and more particularly, to a PCB including a resistance pad, a memory module including the PCB, and a memory system including the memory module.

2. Description of Related Art

Generally, a pair of pads of a memory module may be connected with each other through a passive element such as a serial resistance. The passive element may form a discontinuous section of a signal transmitted by the pads.

To reduce the discontinuous section, the pad having a small size and the passive element having a small size may be used. However, when the passive element may have the small size, desired impedance may not be provided to the memory module. Further, the small passive element may be detached from the small pad due to an external impact.

Thus, reducing the size of the pad may be restricted. As a result, the pad having a large size may have a high capacitance. The pad having the high capacitance may deteriorate characteristics of the signal.

SUMMARY

According to example embodiments, there may be provided a PCB. The PCB may include a first insulating layer, a pad disposed on the first insulating layer, and a first reference layer on which the first insulating layer may be disposed, the first reference layer including a dielectric passage for forming a return path of a signal that may be transmitted to the pad, and a conductive line disposed in the dielectric passage and disposed to form a transmission path of the signal. The PCB may further include a second insulating layer on which the first reference layer may be disposed, and a second reference layer on which the second insulating layer may be disposed, the second reference layer further forming the return path. A capacitance of the pad may correspond to a distance between the pad and the second reference layer.

According to example embodiments, there may be provided a memory module. The memory module may include a first insulating layer, a first resistive pad and a second resistive pad disposed on the first insulating layer, and a resistance disposed between and connected to the first resistive pad and the second resistive pad. The memory module may further include a tab disposed on the first insulating layer and configured to transmit a signal to the first resistive pad, a signal line disposed on the first insu-
lating layer and connected to the second resistive pad, and a semiconductor package mounted on the signal line. The memory module may further include a first reference layer on which the first insulating layer may be disposed, the first reference layer including a first dielectric passage disposed under the first resistive pad, the second resistive pad and the resistance and disposed to form a return path of the signal, and a first conductive line disposed in the first dielectric passage and disposed to form a transmission path of the signal, a second insulating layer on which the first reference layer may be disposed, and a second reference layer on which the second insulating layer may be disposed, the second reference layer further forming the return path. A capacitance of the first resistive pad and the second resistive pad may correspond to a distance between the first resistive pad and the second resistive pad and the second reference layer.

According to example embodiments, there may be provided a memory system. The memory system may include a main board, a central processing unit (CPU) connected to the main board, and a memory module mounted on the main board. The memory module may include a first insulating layer, a first resistive pad and a second resistive pad disposed on the first insulating layer, and a resistance disposed between and connected to the first resistive pad and the second resistive pad. The memory module may further include a tab disposed on the first insulating layer and configured to transmit a signal to the first resistive pad, a signal line disposed on the first insulating layer and connected to the second resistive pad, and a semiconductor package mounted on the signal line. The memory module may further include a first reference layer on which the first insulating layer may be disposed, the first reference layer including a dielectric passage disposed under the first resistive pad, the second resistive pad and the resistance and disposed to form a return path of the signal, and a conductive line disposed in the dielectric passage and disposed to form a transmission path of the signal, a second insulating layer on which the first reference layer may be disposed, and a second reference layer on which the second insulating layer may be disposed, the second reference layer further forming the return path. A capacitance of the first resistive pad and the second resistive pad may correspond to a distance between the first resistive pad and the second resistive pad and the second reference layer.

DETAILED DESCRIPTION OF THE EMBODIMENTS

Example embodiments provide a printed circuit board (PCB) that may be capable of decreasing a capacitance of a pad.

Example embodiments also provide a memory module including the above-mentioned PCB.

Example embodiments still also provide a memory system including the above-mentioned memory module.

PCB

Figure 1:
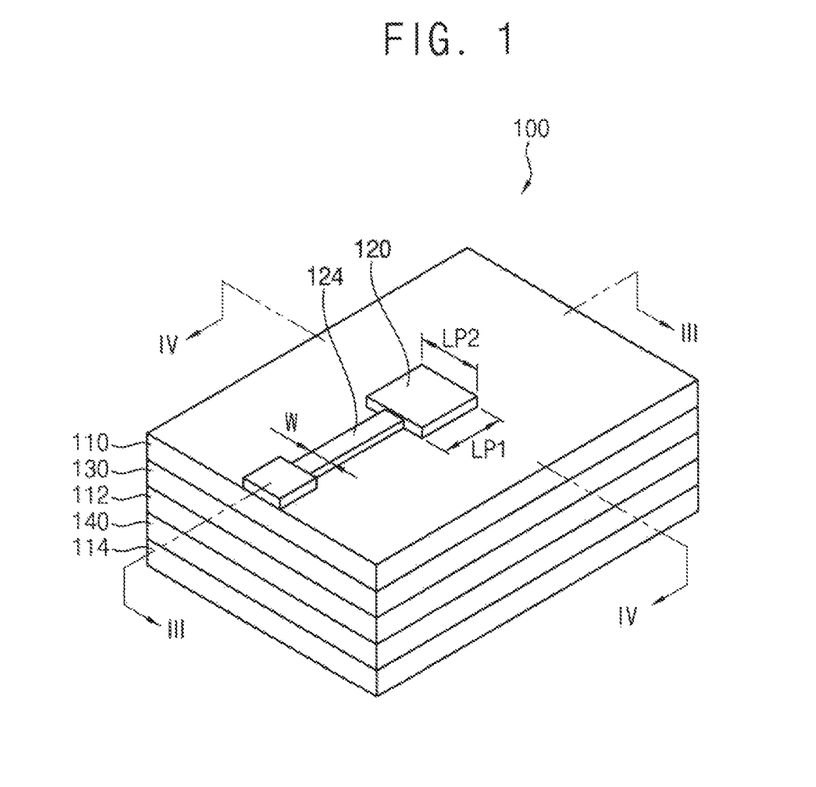
FIG. 1 is a perspective view illustrating a PCB in accordance with example embodiments.
Figure 2:
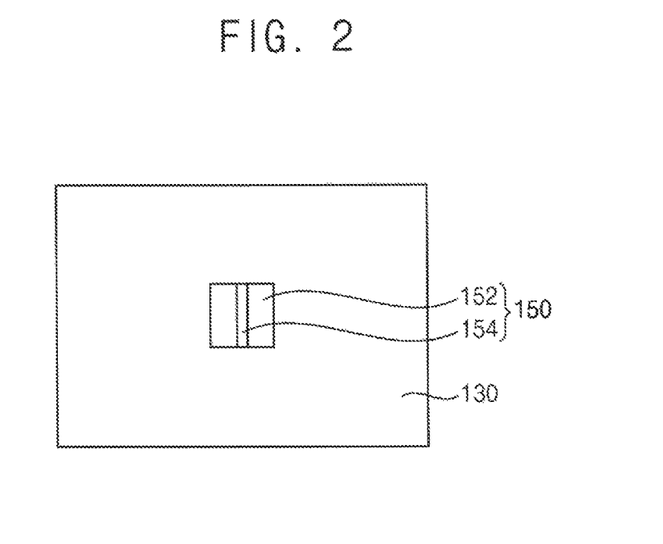
FIG. 2 is a plan view illustrating a first reference layer of the PCB in FIG. 1.
Figure 3:
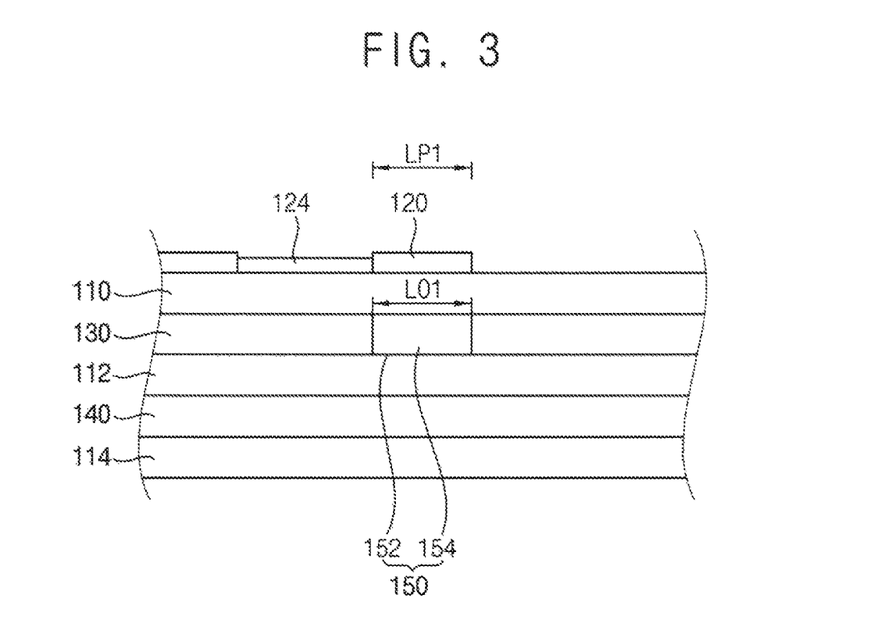
FIG. 3 is a cross-sectional view taken along a line III-III' in FIG. 1.
Figure 4:
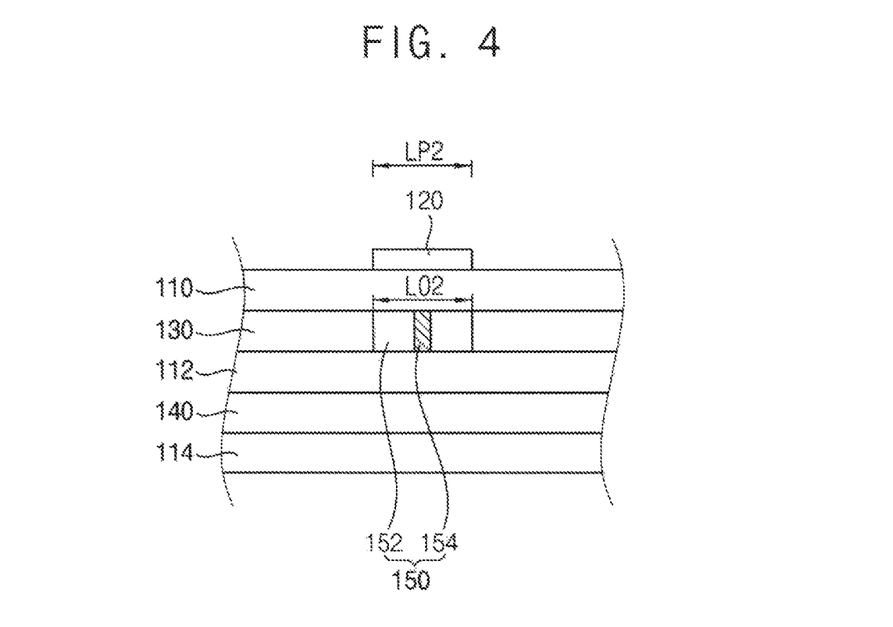
FIG. 4 is a cross-sectional view taken along a line IV-IV' in FIG. 1.

FIG. 1 is a perspective view illustrating a PCB in accordance with example embodiments, FIG. 2 is a plan view illustrating a first reference layer of the PCB in FIG. 1, FIG. 3 is a cross-sectional view taken along a line III-III' in FIG. 1, and FIG. 4 is a cross-sectional view taken along a line IV-IV' in FIG. 1.

Referring to FIGS. 1 to 4, a PCB 100 may include a first insulating layer 110, a second insulating layer 112, a third insulating layer 114, a pad 120, a first reference layer 130 and a second reference layer 140.

The first reference layer 130 may be arranged under the first insulating layer 110. The second insulating layer 112 may be arranged under the first reference layer 130. That is, the first reference layer 130 may be interposed between the first insulating layer 110 and the second insulating layer 112. Thus, the first reference layer 130 may have an upper surface configured to make contact with a lower surface of the first insulating layer 110, and a lower surface configured to make contact with an upper surface of the second insulating layer 112.

The second reference layer 140 may be arranged under the second insulating layer 112. The third insulating layer 114 may be arranged under the second reference layer 140. That is, the second reference layer 140 may be interposed between the second insulating layer 112 and the third insulating layer 114. Thus, the second reference layer 140 may have an upper surface configured to make contact with a lower surface of the second insulating layer 112, and a lower surface configured to make contact with an upper surface of the third insulating layer 114. The first reference layer 130 and the second reference layer 140 may be electrically connected with each other through via contacts vertically formed through the first to third insulating layers 110, 112 and 114.

In example embodiments, the first to third insulating layers 110, 112 and 114 may include a thin insulating film. The first and second reference layers 130 and 140 may include a thin conductive film. Additionally, the PCB 100 may further include at least one reference layer under the second reference layer 140.

In this case, the second reference layer 140 may be arranged on the upper surface of the third insulating layer 114. The second reference layer 140 may be thermally compressed to the third insulating layer 114 to attach the second reference layer 140 to the third insulating layer 114. The second insulating layer 112 may be arranged on the upper surface of the second reference layer 140. The second insulating layer 112 may be thermally compressed to the second reference layer 140 to attach the second insulating layer 112 to the second reference layer 140. The first reference layer 130 may be arranged on the upper surface of the second insulating layer 112. The first reference layer 130 may be thermally compressed to the second insulating layer 112 to attach the first reference layer 130 to the second insulating layer 112. The first insulating layer 110 may be arranged on the upper surface of the first reference layer 130. The first insulating layer 110 may be thermally compressed to the first reference layer 130 to attach the first insulating layer 110 to the first reference layer 130. The thermal compression processes may be simultaneously performed on the third insulating layer 114, the second reference layer 140, the second insulating layer 112, the first reference layer 130 and the first insulating layer 110 sequentially stacked.

In example embodiments, the first and second reference layers 130 and 140 may include a ground layer. Alternatively, the first and second reference layers 130 and 140 may include a power layer.

The pad 120 may be arranged on the upper surface of the first insulating layer 110. A signal may be transmitted to the pad 120 through a signal line 124 connected to the pad 120. In example embodiments, a passive element may be mounted on the pad 120. The passive element may be configured to connect the pad 120 with an adjacent pad. The passive element may include a resistance. In this case, the pad 120 may include a resistive pad. The signal may include a direct current.

In example embodiments, the pad 120 may have a rectangular parallelepiped shape having a thin thickness. Thus, the pad 120 may have a first length LP1 measured along a lengthwise direction of the signal line 124, i.e., a transmission direction of the signal, and a second length LP2 measured along a direction substantially perpendicular to the transmission direction of the signal. When the second length LP2 of the pad 120 may be no more than a width W of the signal line 124 measured along the direction substantially perpendicular to the transmission direction of the signal, the pad 120 may not have desired impedance. Thus, the second length LP2 of the pad 120 may be longer than the width W of the signal line 124.

The impedance of the pad 120 may be inversely proportional to a capacitance of the pad 120, which may be determined based on a distance between the pad 120 and the second reference layer 140. Thus, to increase the impedance of the pad 120, the capacitance of the pad 120 may be decreased. Because the capacitance of the pad 120 may be inversely proportional to a thickness of a dielectric layer, the capacitance of the pad 120 may be reduced by increasing the thickness of the dielectric layer.

Because the first reference layer 130 may be arranged under the pad 120, a return path of the signal transmitted to the pad 120 may correspond to a path between the pad 120 and the first reference layer 130. Thus, the dielectric layer may correspond to the first insulating layer 110. The capacitance of the pad 120 may be determined by a thickness of the first insulating layer 110. The capacitance of the pad 120 may be reduced by increasing the thickness of the first insulating layer 110. However, increasing the thickness of the first insulating layer 110 may result in increasing a thickness of the PCB 100, so increasing the thickness of the first insulating layer 110 may be restricted.

In example embodiments, the first reference layer 130 may include a dielectric passage 150. The dielectric passage 150 may be formed at a portion of the first reference layer 130. The dielectric passage 150 may function as to provide the first insulating layer 110 and the second insulating layer 112 with the dielectric layer.

The dielectric passage 150 may include an opening 152 and a conductive line 154. The opening 152 may correspond to an empty space formed at the portion of the first reference layer 130 under the pad 120. Thus, the lower surface of the first insulating layer 110 may be exposed through an upper surface of the opening 152. The upper surface of the second insulating layer 112 may be exposed through a lower surface of the opening 152. Therefore, the return path of the signal may correspond to a path from the pad 120 to the second reference layer 140 through the opening 152. The thickness of the dielectric layer may correspond to a summed thickness of a thickness of the first insulating layer 110, a thickness of the opening 152 and a thickness of the second insulating layer 112. As a result, the thickness of the dielectric layer may be increased to reduce the capacitance of the pad 120. The opening 152 may be formed by partially removing the first reference layer 130 through an etch process.

To effectively reduce the capacitance of the pad 120, the opening 152 may have a size larger than that of the pad 120. The opening 152 may have a first length LO1 measured along the transmission direction of the signal, and a second length LO2 measured along the direction substantially perpendicular to the transmission direction of the signal. The first length LO1 of the opening 152 may be no less than the first length LP1 of the pad 120. The second length LO2 may be no less than the second length LP2 of the pad 120. However, because the opening 152 may have the function of the dielectric passage 150, it may not be required to provide the opening 152 with the size no less than the size of the pad 120. For example, the size of the opening 152 may be smaller than the size of the pad 120.

The opening 152 may cause a delay of the signal, e.g., the direct current through the first reference layer 130. To prevent the signal delay, the conductive line 154 may be arranged in the opening 152. The conductive line 154 may be electrically connected between portions of the first reference layer 130 at both sides of the opening 152. That is, the conductive line 154 may be extended in the opening 152 along the transmission direction of the signal. The signal, e.g., the direct current, may be transmitted through the conductive line 154 along the first reference layer 130 without the delay.

Figure 5:
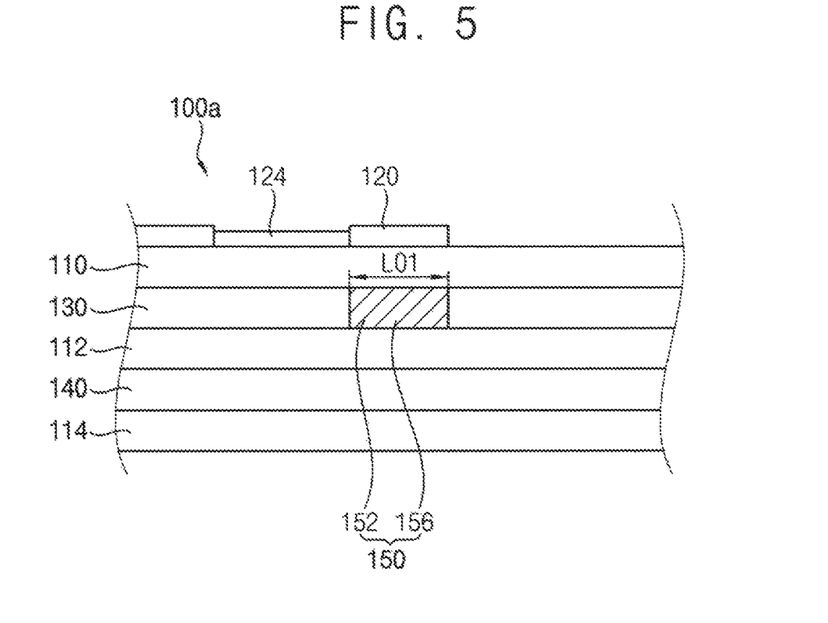
FIGS. 5 and 6 are cross-sectional views illustrating a PCB in accordance with example embodiments.
Figure 6:
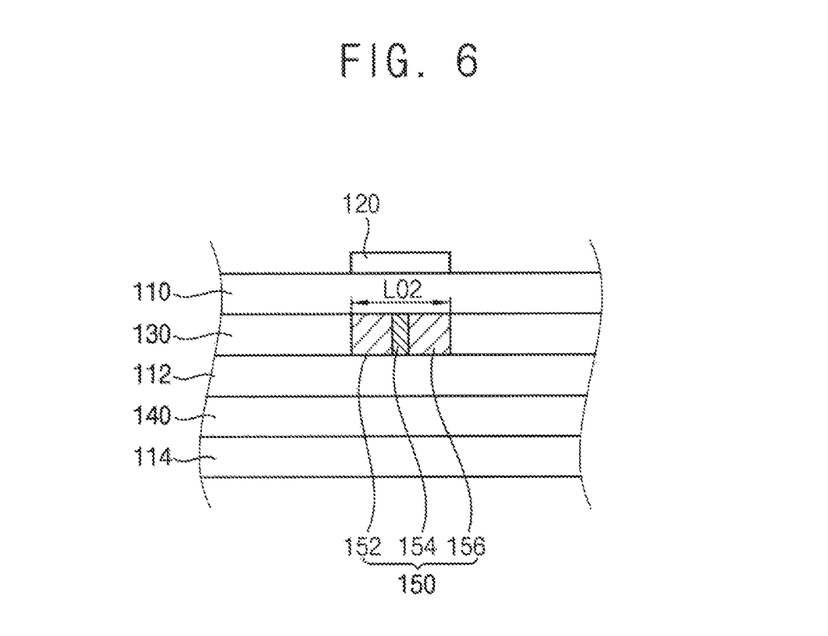

FIGS. 5 and 6 are cross-sectional views illustrating a PCB in accordance with example embodiments.

A PCB 100a may include elements substantially the same as those of the PCB 100 in FIGS. 3 and 4 except for a dielectric passage. Thus, the same reference numerals may refer to the same elements and any further illustrations with respect to the same elements may be omitted herein for brevity.

Referring to FIGS. 5 and 6, the dielectric passage 150 may further include a dielectric member 156. The dielectric member 156 may be arranged in the opening 152. The dielectric member 156 may be formed by filling the opening 152 with a dielectric material. The dielectric material of the dielectric member 156 may be substantially the same as that of the first insulating layer 110. Alternatively, the dielectric material of the dielectric member 156 may be different from that of the first insulating layer 110.

Memory Module

Figure 7:
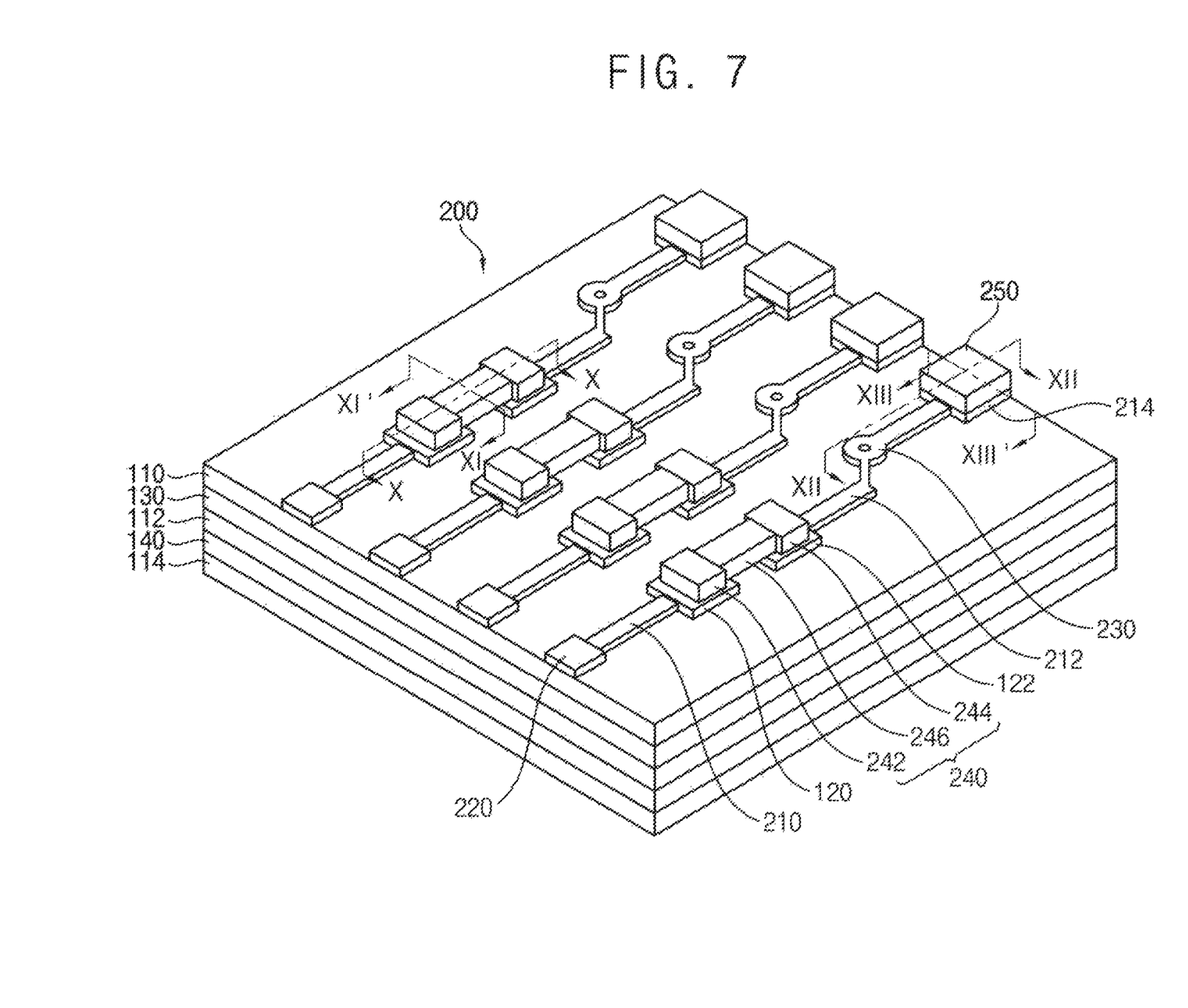
FIG. 7 is a perspective view illustrating a memory module including the PCB in FIG. 1.
Figure 8:
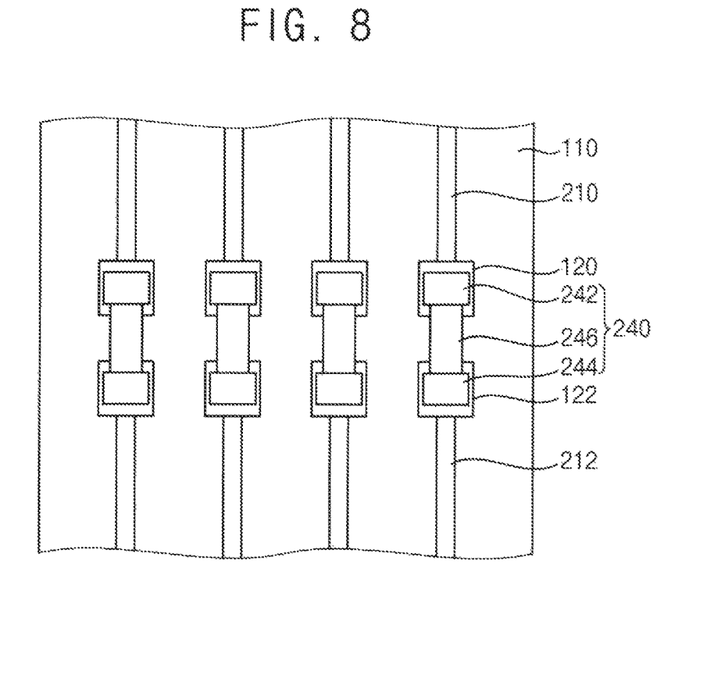
FIG. 8 is a plan view illustrating the memory module in FIG. 7.
Figure 9:
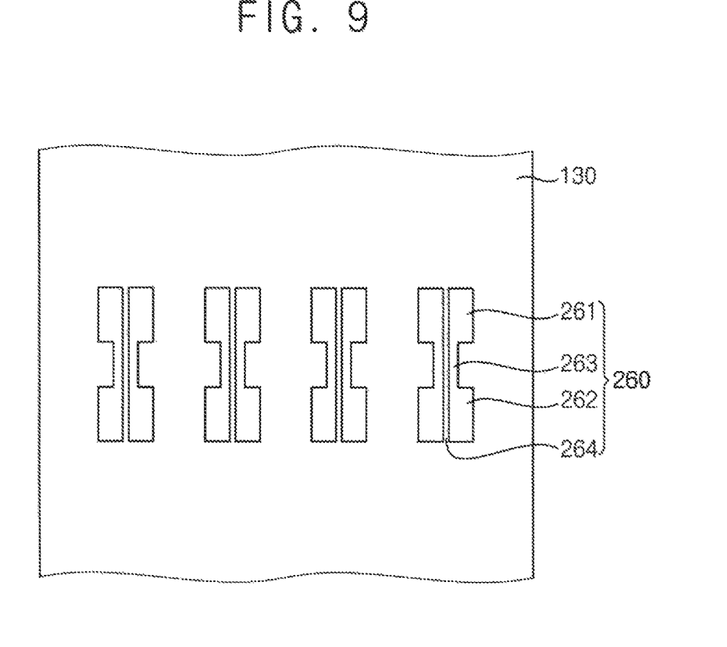
FIG. 9 is a plan view illustrating a first reference layer of the memory module in FIG. 7.
Figure 10:
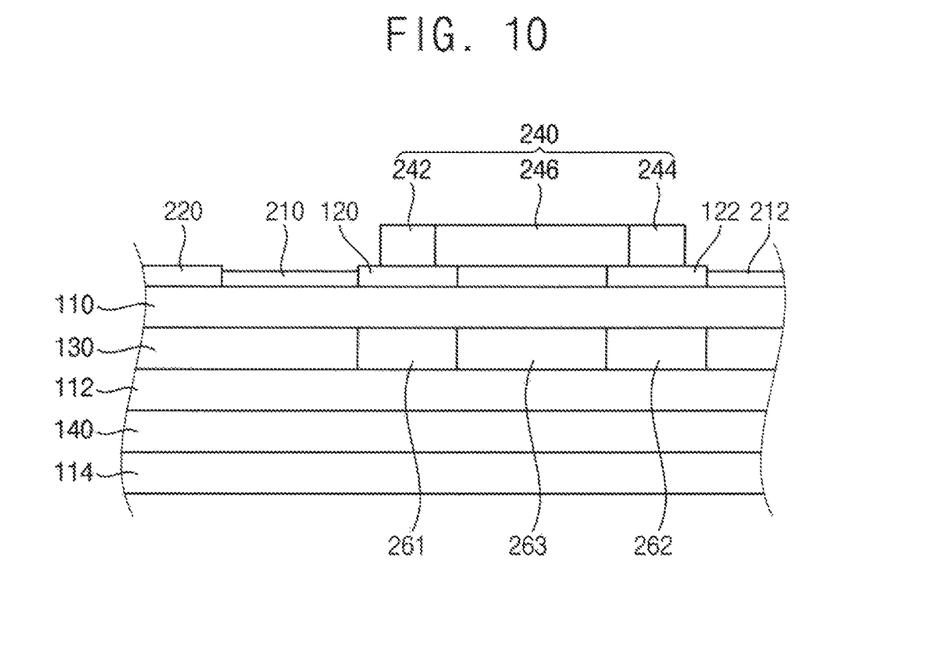
FIG. 10 is a cross-sectional view taken along a line X-X' in FIG. 7.
Figure 11:
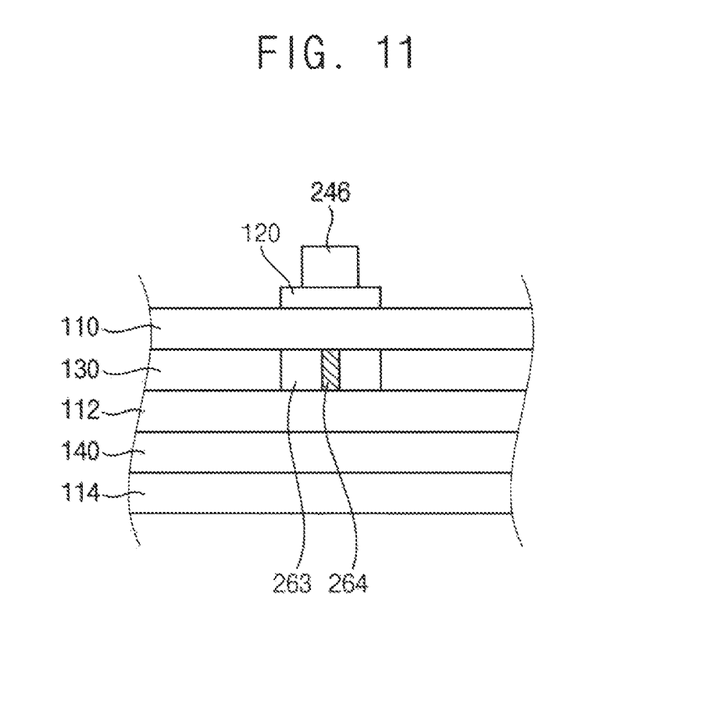
FIG. 11 is a cross-sectional view taken along a line XI-XI' in FIG. 7.
Figure 12:
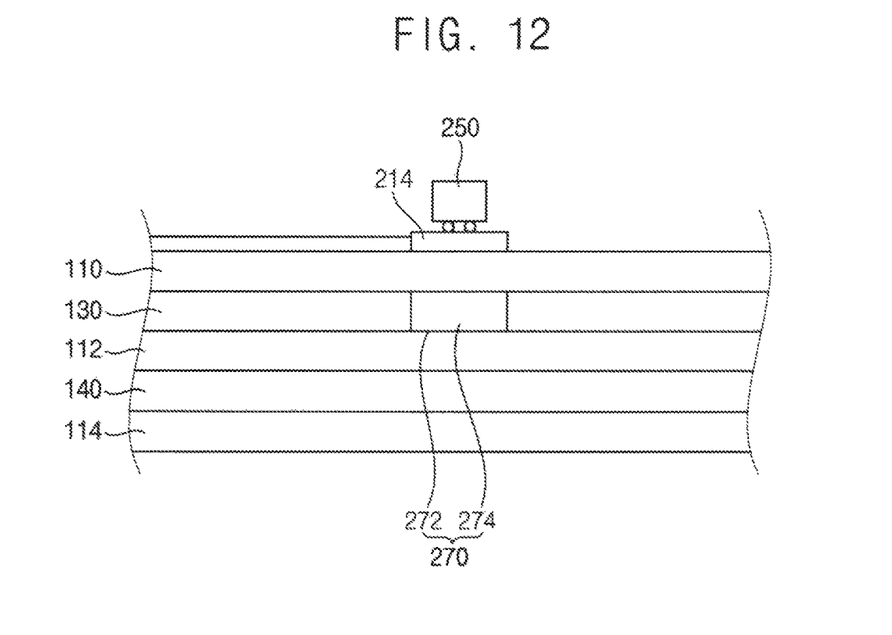
FIG. 12 is a cross-sectional view taken along a line XII-XII' in FIG. 7.
Figure 13:
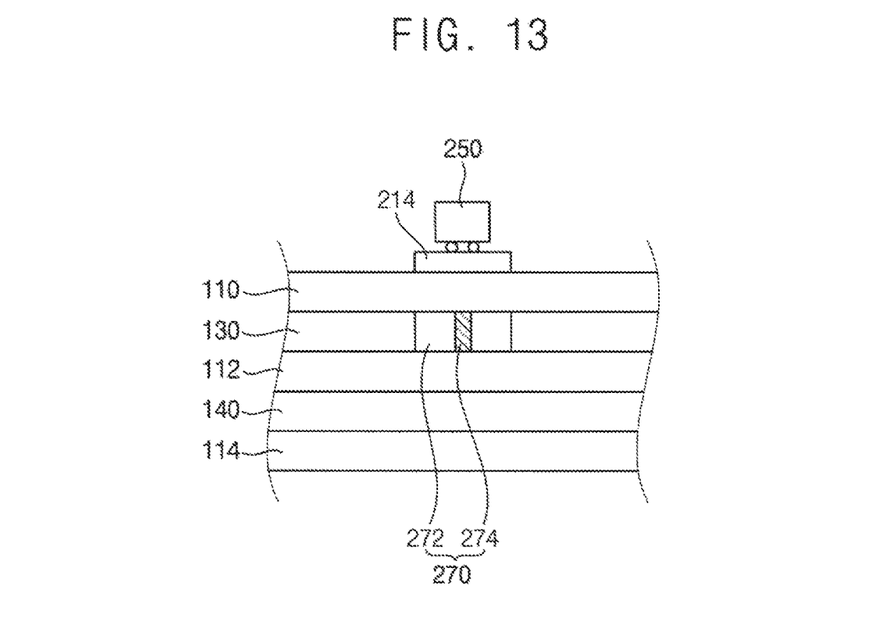
FIG. 13 is a cross-sectional view taken along a line XIII-XIII' in FIG. 7.

FIG. 7 is a perspective view illustrating a memory module including the PCB in FIG. 1, FIG. 8 is a plan view illustrating the memory module in FIG. 7, FIG. 9 is a plan view illustrating a first reference layer of the memory module in FIG. 7, FIG. 10 is a cross-sectional view taken along a line X-X' in FIG. 7, FIG. 11 is a cross-sectional view taken along a line XI-XI' in FIG. 7, FIG. 12 is a cross-sectional view taken along a line XII-XII' in FIG. 7, and FIG. 13 is a cross-sectional view taken along a line XIII-XIII' in FIG. 7.

Referring to FIGS. 7 to 13, a memory module 200 may include a first insulating layer 110, a second insulating layer 112, a third insulating layer 114, a first resistive pad 120, a second resistive pad 122, a first reference layer 130, a second reference layer 140, a first signal line 210, a second signal line 212, a tab 220, a via contact 230, a resistance 240 and a semiconductor package 250.

The first reference layer 130 may be arranged under the first insulating layer 110. The second insulating layer 112 may be arranged under the first reference layer 130. That is, the first reference layer 130 may be interposed between the first insulating layer 110 and the second insulating layer 112. Thus, the first reference layer 130 may have an upper surface configured to make contact with a lower surface of the first insulating layer 110, and a lower surface configured to make contact with an upper surface of the second insulating layer 112.

The second reference layer 140 may be arranged under the second insulating layer 112. The third insulating layer 114 may be arranged under the second reference layer 140. That is, the second reference layer 140 may be interposed between the second insulating layer 112 and the third insulating layer 114. Thus, the second reference layer 140 may have an upper surface configured to make contact with a lower surface of the second insulating layer 112, and a lower surface configured to make contact with an upper surface of the third insulating layer 114. In example embodiments, the first and second reference layers 130 and 140 may include a ground layer.

The first resistive pad 120 and the second resistive pad 122 may be arranged on the upper surface of the first insulating layer 110. The second resistive pad 122 may be spaced apart from the first resistive pad 120. The first and second resistive pads 120 and 122 may have a size substantially the same as that of the pad 120 in FIG. 1.

The first signal line 210 may be formed on the upper surface of the first insulating layer 110. The first signal line 210 may be connected to the first resistive pad 120. The tab 220 may be connected to the first signal line 210. The second signal line 212 may be formed on the upper surface of the first insulating layer 110. The second signal line 212 may be connected to the second resistive pad 122.

The resistance 240 may be electrically connected between the first resistive pad 120 and the second resistive pad 122. The resistance 240 may include a first mount portion 242, a second mount portion 244 and a connection portion 246. The first mount portion 242 may be mounted on the first resistive pad 120. The second mount portion 244 may be mounted on the second resistive pad 122. The connection portion 246 may be connected between the first mount portion 242 and the second mount portion 244.

In example embodiments, the first and second mount portions 242 and 244 may have a size smaller than that of the first and second resistive pad 120 and 122. The connection portion 246 may have a length shorter than a length of the first and second mount portions 242 and 244 measured along the direction substantially perpendicular to the transmission direction of the signal.

The first reference layer 130 may include a dielectric passage 260. The dielectric passage 260 may include first to third openings 261, 262 and 263 and a conductive line 264. The first opening 261 may be formed at a portion of the first reference layer 130 under the first resistive pad 120. The second opening 262 may be formed at a portion of the first reference layer 130 under the second resistive pad 122. The third opening 263 may be formed at a portion of the first reference layer 130 under the connection portion 246 of the resistance 240. The third opening 263 may be in fluidic communication with the first and second openings 261 and 262. The first to third openings 261, 262 and 263 may have functions substantially the same as those of the opening 152 in FIGS. 3 and 4. Thus, any further illustrations with respect to the functions of the first to third openings 261, 262 and 263 may be omitted herein for brevity.

In example embodiments, the first opening 261 may have a size larger than that of the first resistive pad 120. The second opening 262 may have a size larger than that of the second resistive pad 122. The third opening 263 may have a size larger than that of the connection portion 246 of the resistance 240.

The conductive line 264 may be arranged in the first to third openings 261, 262 and 263. The conductive line 264 may be arranged in the first to third openings 261, 262 and 263 along the transmission direction of the signal to electrically connect portions of the first reference layer 130 at both sides of the first to third openings 261, 262 and 263 with each other. The conductive line 264 may have functions substantially the same as those of the conductive line 154 in FIGS. 3 and 4. Thus, any further illustrations with respect to the functions of the conductive line 264 may be omitted herein for brevity.

The via contact 230 may be vertically formed in the first and second insulating layers 110 and 112 to electrically connect the second signal line 212 with the first and second reference layers 130 and 140.

A mount pad 214 may be formed on the second signal line 212. The semiconductor package 250 may be mounted on the mount pad 214. In example embodiments, the semiconductor package 250 may include a dynamic random access memory (DRAM).

The first reference layer 130 may further include a second dielectric passage 270. The second dielectric passage 270 may function as to reduce a capacitance of the mount pad 214. The second dielectric passage 270 may include an opening 272 and a conductive line 274.

The opening 272 may be formed at a portion of the first reference layer 130 under the mount pad 214. The opening 272 may have functions substantially the same as those of the opening 152 in FIGS. 3 and 4. Thus, any further illustrations with respect to the functions of the opening 272 may be omitted herein for brevity.

The conductive line 274 may be arranged in the opening 272. The conductive line 274 may be arranged in the opening 272 along the transmission direction of the signal to electrically connect portions of the first reference layer 130 at both sides of the opening 272 with each other. The conductive line 274 may have functions substantially the same as those of the conductive line 154 in FIGS. 3 and 4. Thus, any further illustrations with respect to the functions of the conductive line 274 may be omitted herein for brevity.

Alternatively, the memory module 200 may include the PCB 100a in FIGS. 5 and 6.

Memory System

Figure 14:
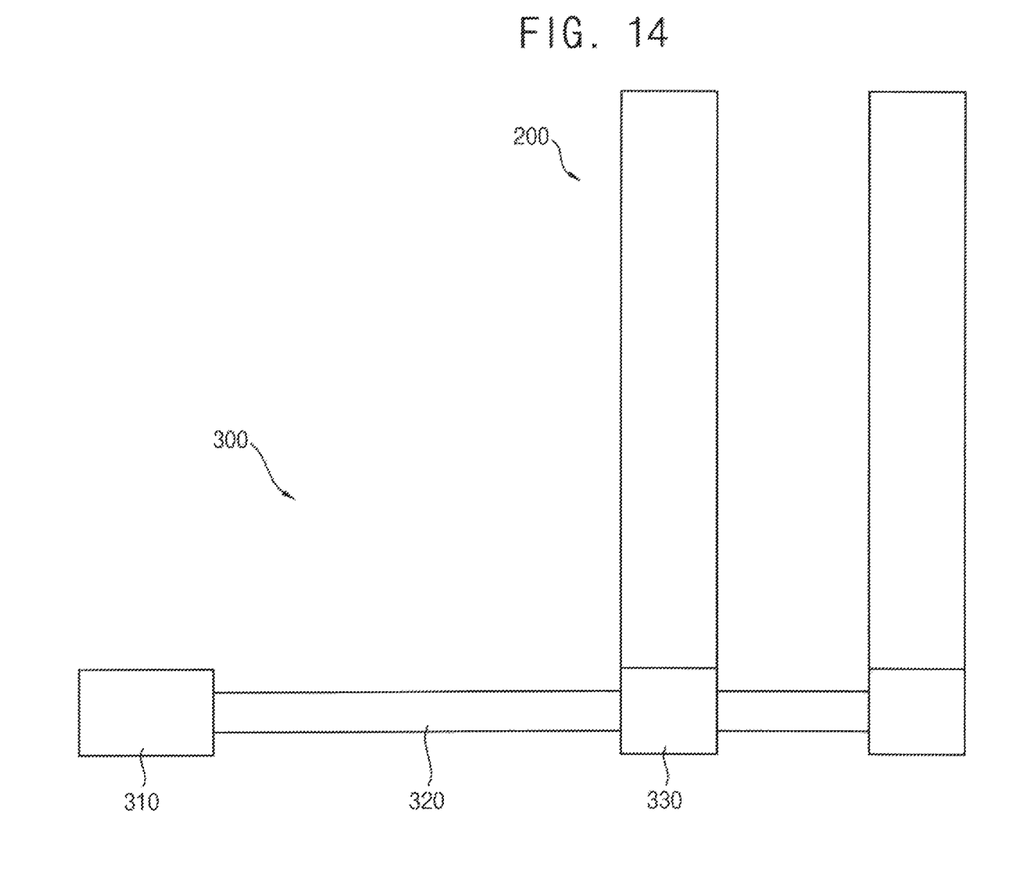
FIG. 14 is a cross-sectional view illustrating a memory system including the memory module in FIG. 7.
Figure 15:
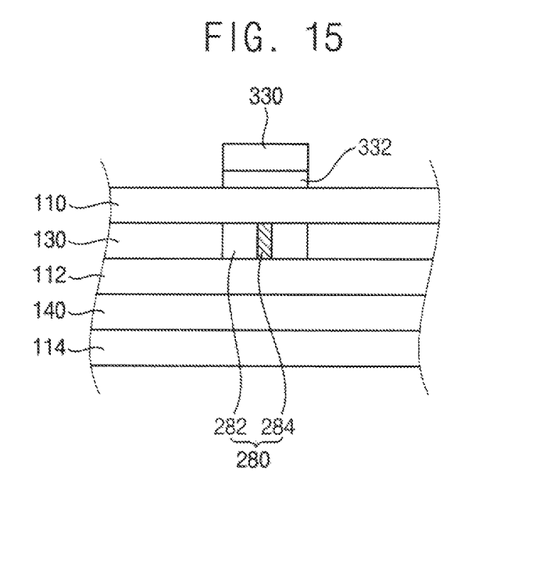
FIG. 15 is a cross-sectional view illustrating a mount structure of a connector in the memory system of FIG. 14.

FIG. 14 is a cross-sectional view illustrating a memory system including the memory module in FIG. 7, and FIG. 15 is a cross-sectional view illustrating a mount structure of a connector in the memory system of FIG. 14.

Referring to FIGS. 14 and 15, a memory system 300 may include a central processing unit (CPU) 310, a main board 320, a connector 330 and at least one memory module 200.

The CPU 310 may be mounted on the main board 320. The connector 330 may be mounted on the main board 320. The connector 330 may include a DIMM connector. The memory module 200 may be electrically connected with the connector 330. Thus, signals outputted from the CPU 310 may be transmitted to the memory module 200 through the main board 320 and the connector 330.

The memory module 200 may include elements substantially the same as those of the memory module in FIG. 7. Thus, any further illustrations with respect to the memory module 200 may be omitted herein for brevity.

A connector pad 332 may be arranged on the upper surface of the first insulating layer 110. The connector 330 may be mounted on the connector pad 332. The first reference layer 130 may further include a third dielectric passage 280. The third dielectric passage 280 may function as to reduce a capacitance of the connector pad 332. The third dielectric passage 280 may include an opening 282 and a conductive line 284.

The opening 282 may be formed at a portion of the first reference layer 130 under the connector pad 332. The opening 282 may have functions substantially the same as those of the opening 152 in FIGS. 3 and 4. Thus, any further illustrations with respect to the functions of the opening 282 may be omitted herein for brevity.

The conductive line 284 may be arranged in the opening 282. The conductive line 284 may be arranged in the opening 282 along the transmission direction of the signal to electrically connect portions of the first reference layer 130 at both sides of the opening 282 with each other. The conductive line 284 may have functions substantially the same as those of the conductive line 154 in FIGS. 3 and 4. Thus, any further illustrations with respect to the functions of the conductive line 284 may be omitted herein for brevity.

Figure 16:
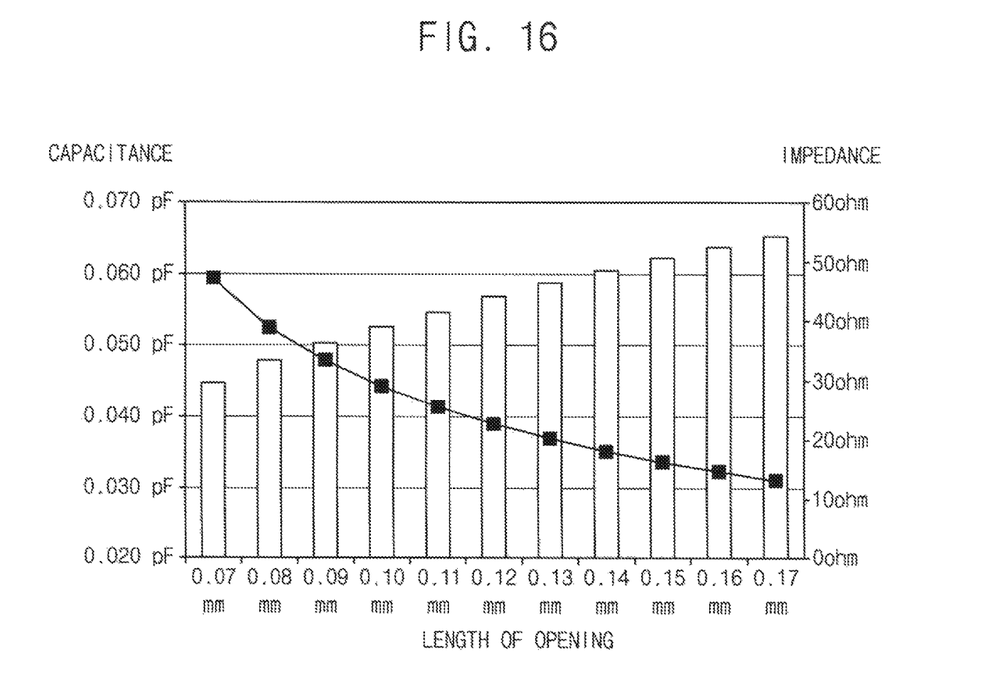
FIG. 16 is a graph showing changes of capacitances and impedance in a pad by a dielectric passage in accordance with example embodiments.

FIG. 16 is a graph showing changes of capacitances and impedance in a pad by a dielectric passage in accordance with example embodiments. In FIG. 16, a horizontal axis may represent a length of the opening, a left vertical axis may represent the capacitance of the pad, and a right vertical axis may represent the impedance of the pad. A curved line may indicate capacitance changes of the pad, and a histogram may indicate impedance changes of the pad.

As shown in FIG. 16, it may be noted that the capacitance of the pad may be gradually decreased in proportion to increasing the length of the opening in the first reference layer. Thus, it may be noted that the impedance of the pad may be gradually increased.

According to example embodiments, the return path of the signal may be extended to the second reference layer, not the first reference layer, owing to the dielectric passage of the first reference layer. Thus, the capacitance of the pad may be reduced to increase impedance of the pad. Further, portions of the first reference layer at both sides of the dielectric passage may be connected by the conductive line. Therefore, the signal may be transmitted through the conductive line between the portions of the first reference layer without a discontinuous section. As a result, signal integrity may be remarkably improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. Therefore, it is to be understood that the foregoing is illustrative of the example embodiments and is not to be construed as limited to the example embodiments disclosed, and that modifications to the disclosed example embodiments, as well as other example embodiments, are intended to be included within the scope of the appended claims.

What is claimed is:

1. A printed circuit board (PCB) comprising:
   a first insulating layer;
   a pad disposed on the first insulating layer;
   a first reference layer on which the first insulating layer is disposed, the first reference layer comprising:
      a dielectric passage disposed through the first reference layer, and for forming a return path of a signal that is transmitted to the pad; and
      a conductive line disposed in and through the dielectric passage, and for forming a transmission path of the signal;
   a second insulating layer on which the first reference layer is disposed; and
   a second reference layer on which the second insulating layer is disposed, the second reference layer further forming the return path,
   wherein a capacitance of the pad corresponds to a distance between the pad and the second reference layer.

2. The PCB of claim 1, wherein the dielectric passage comprises an opening disposed through the first reference layer.

3. The PCB of claim 2, wherein the dielectric passage further comprises a dielectric member disposed in the opening.

4. The PCB of claim 2, wherein the opening has a first size larger than a second size of the pad.

5. The PCB of claim 2, wherein the opening has a first length no less than a second length of the pad.

6. The PCB of claim 1, wherein the conductive line is disposed along a transmission direction of the signal and disposed to electrically connect portions of the first reference layer at both sides of the dielectric passage with each other.

7. A memory module comprising:
   a first insulating layer;
   a first resistive pad and a second resistive pad disposed on the first insulating layer;
   a resistance disposed between and connected to the first resistive pad and the second resistive pad;
   a tab disposed on the first insulating layer and configured to transmit a signal to the first resistive pad;
   a signal line disposed on the first insulating layer and connected to the second resistive pad;
   a semiconductor package mounted on the signal line;
   a first reference layer on which the first insulating layer is disposed, the first reference layer comprising a first dielectric passage disposed under the first resistive pad, the second resistive pad and the resistance and disposed to form a return path of the signal, and a first conductive line disposed in the first dielectric passage and disposed to form a transmission path of the signal;
   a second insulating layer on which the first reference layer is disposed; and
   a second reference layer on which the second insulating layer is disposed, the second reference layer further forming the return path,
   wherein a capacitance of the first resistive pad and the second resistive pad corresponds to a distance between the first resistive pad and the second resistive pad and the second reference layer.

8. The memory module of claim 7, wherein the first dielectric passage comprises:
   a first opening disposed through a first portion of the first reference layer under the first resistive pad;
   a second opening disposed through a second portion of the first reference layer under the second resistive pad; and
   a third opening disposed through a third portion of the first reference layer under the resistance.

9. The memory module of claim 8, wherein the third opening is in fluidic communication with the first opening and the second opening.

10. The memory module of claim 8, wherein the first opening has a first size larger than a second size of the first resistive pad,
    the second opening has a third size larger than a fourth size of the second resistive pad, and
    the third opening has a fifth size larger than a sixth size of the resistance.

11. The memory module of claim 10, wherein the first resistive pad and the second resistive pad have a first width wider than a second width of the signal line,
    the resistance has a third width narrower than the first width of the first resistive pad and the second resistive pad, and
    the third opening has a fourth width narrower than a fifth width of the first opening and the second opening.

12. The memory module of claim 8, wherein the first conductive line is disposed in the first opening, the second opening and the third opening and disposed along a transmission direction of the signal.

13. The memory module of claim 8, wherein the first dielectric passage further comprises:
    a first dielectric member disposed in the first opening;
    a second dielectric member disposed in the second opening; and
    a third dielectric member disposed in the third opening.

14. The memory module of claim 7, further comprising a mount pad disposed on the first reference layer and connected to the signal line,
    wherein the semiconductor package is mounted on the mount pad.

15. The memory module of claim 14, wherein the first reference layer further comprises:
    a second dielectric passage disposed through a portion of the first reference layer under the mount pad; and
    a second conductive line disposed in the second dielectric passage.

16. The memory module of claim 15, wherein the second dielectric passage comprises an opening.

17. The memory module of claim 7, wherein the semiconductor package comprises a dynamic random access memory (DRAM).

18. A memory system comprising:
    a main board;
    a central processing unit (CPU) connected to the main board; and
    a memory module mounted on the main board, wherein the memory module comprises:
  a first insulating layer;
  a first resistive pad and a second resistive pad disposed on the first insulating layer;
  a resistance disposed between and connected to the first resistive pad and the second resistive pad;
  a tab disposed on the first insulating layer and configured to transmit a signal to the first resistive pad;
  a signal line disposed on the first insulating layer and connected to the second resistive pad;
  a semiconductor package mounted on the signal line;
  a first reference layer on which the first insulating layer is disposed, the first reference layer comprising a dielectric passage disposed under the first resistive pad, the second resistive pad and the resistance and disposed to form a return path of the signal, and a conductive line disposed in the dielectric passage and disposed to form a transmission path of the signal;
  a second insulating layer on which the first reference layer is disposed; and
  a second reference layer on which the second insulating layer is disposed, the second reference layer further forming the return path,
  wherein a capacitance of the first resistive pad and the second resistive pad corresponds to a distance between the first resistive pad and the second resistive pad and the second reference layer.

19. The memory system of claim 18, further comprising a connector configured to connect the main board with the memory module.

20. The memory system of claim 18, wherein the semiconductor package comprises a dynamic random access memory (DRAM).

* * * * *